United States Patent [19]

Araki

[11] Patent Number: 5,384,549
[45] Date of Patent: Jan. 24, 1995

[54] AMPLIFIER INCORPORATING CURRENT-LIMITING PROTECTION OF OUTPUT TRANSISTOR

[75] Inventor: Toru Araki, Itami, Japan

[73] Assignee: Mitsubishi Denki Kabushiki Kaisha, Tokyo, Japan

[21] Appl. No.: 159,365

[22] Filed: Nov. 30, 1993

[30] Foreign Application Priority Data

Dec. 1, 1992 [JP] Japan .................. 4-322042

[51] Int. Cl.$^6$ .......................... H03F 3/04; H02H 7/20
[52] U.S. Cl. ........................... 330/298; 330/257; 361/93
[58] Field of Search ............... 330/207 P, 259, 298, 330/257; 361/87, 93, 100, 101

[56] References Cited

U.S. PATENT DOCUMENTS

| | | | |
|---|---|---|---|
| 4,232,273 | 11/1980 | Leidich | 330/298 |
| 4,530,026 | 7/1985 | Noro | 330/298 X |
| 5,010,303 | 4/1991 | Braun | 330/259 X |

FOREIGN PATENT DOCUMENTS 1941694 2/1971 Germany .................. 330/207 P

Primary Examiner—James B. Mullins
Attorney, Agent, or Firm—Leydig Voit & Mayer

[57] ABSTRACT

An amplifier circuit having a stabilized power supply circuit as a power source is arranged to ensure that, when the output is short-circuited to a power supply line, the amplifier circuit and the stabilized power supply circuit are protected, the output from the stabilized power supply circuit is stably maintained and the short-circuit failure can be distinguished from use of the amplifier circuit. A first transistor forming a common-emitter circuit constitutes an output section of the amplifier circuit. A second transistor having the same polarity as that of the first transistor has its collector and base connected to each other and to the base of the first transistor. The emitters of the first and second transistors are connected to each other. The emitter of a third transistor forming an emitter-follower circuit is connected to the point of connection between the collector and the base of the second transistor. A current limiter circuit is connected to the collector of the third transistor.

5 Claims, 8 Drawing Sheets

AMPLIFIER INCORPORATING CURRENT-LIMITING PROTECTION OF OUTPUT TRANSISTOR

BACKGROUND OF THE INVENTION

1. FIELD OF THE INVENTION

This invention relates to an amplifier circuit and, more particularly, to a protection operation in a case where an output line from the amplifier circuit is short-circuited to a power supply (Vcc) or ground side of a stabilized power supply circuit for supplying power to the amplifier circuit.

2. DESCRIPTION OF THE RELATED ART

For example, this kind of amplifier circuit is used with a sensor mounted in a motor vehicle or the like. FIG. 6 is a block diagram showing a part of an electronic controller of a motor vehicle. A sensor unit 110 for detecting pressure, temperature and other quantities through a power supply line Vcc, a ground line GND and a signal line S is connected to a control unit 100 (system side) which includes a microprocessor (MPU) 101 and other components. A signal from the sensor unit 110 representing a result of detection is amplified by an amplifier circuit 5 before it is supplied to the control unit 100. Amplifier circuits in accordance with the present invention are used, for example, like this amplifier circuit 5. In more detail, a voltage of, for example, 5 V is supplied to the sensor unit 110 and the MPU 101 from a stabilized power source 3 of the control unit 100 through the power supply line Vcc. The detection signal from the sensor unit 110 is supplied from an output terminal 7 of the amplifier circuit 5 to the MPU 101 of the control unit 100 through the signal line S. In this kind of unit, there is a possibility of the signal line S being short-circuited to the power supply line Vcc or the ground GND by being connected thereto in a connector 111 of the sensor unit 110, as indicated at x in FIG. 6. The MPU 101 determines that the sensor unit 110 is malfunctioning, when the output from the sensor unit 10 is 0.5 V or lower, or 4.5 V or higher (in a failure range). However, it is possible that the output from the sensor unit 110 is out of the failure range even when a short circuit in the connector 111, such as that described above, occurs. In such a situation, the short circuit cannot be detected on the control unit 100 side. A resistance 8 in the control unit 100 represents a load.

FIG. 7 is a schematic block diagram of a circuit system including this kind of amplifier circuit. A minus terminal of a power source 1 is connected to ground 2, and a stabilized power supply circuit 3 is connected to a plus terminal of the power source 1. The stabilized power supply circuit 3 has a stabilized power supply line 4 ($V_{CC}$), which is connected to a semiconductor amplifier circuit 5. An input signal power source 6 generates an input signal to the amplifier circuit 5. A load 8 is connected between an output terminal 7 of the amplifier circuit 5 and $V_{CC}$ 4. An operational amplifier 9 constitutes the amplifier circuit 5. An input resistor 10 is connected between an inverting input terminal of the operational amplifier 9 and the input signal power source 6. A feedback resistor 11 is connected between the inverting input terminal and an output terminal of the operational amplifier 9. A reference power source 12 is connected to a noninverting input terminal of the operational amplifier 9.

FIG. 8 is an equivalent circuit diagram of the operational amplifier 9 of the conventional amplifier circuit. The base of a PNP transistor 13 corresponds to the inverting input of the operational amplifier 9, and the base of a PNP transistor 14 corresponds to the noninverting input of the operational amplifier 9. The emitters of the PNP transistors 13 and 14 are connected to each other to form a differential input pair. A current source 15 is connected between the emitters of the PNP transistors 13 and 14. An NPN transistor 16 has its collector and base connected to the collector of the PNP transistor 13, and an NPN transistor 17 has its collector connected to the collector of the PNP transistor 14. The NPN transistors 16 and 17 have their bases connected to each other and their emitters connected in common to ground 2 to form a current mirror circuit.

An NPN transistor 18 has its base connected to a point of connection between the collectors of the PNP transistor 14 and the NPN transistor 17, and its collector connected to $V_{CC}$ 4 for emitter-follower operation. An NPN transistor 19 has its base connected to the emitter of the NPN transistor 18 and its emitter connected to ground 2 to form a common-emitter circuit. A constant-current source 20 is connected between the collector of the NPN transistor 19 and $V_{CC}$ 4. A resistor 21 is connected between the collector of the NPN transistor 19 and the output terminal 7. A capacitor 22 is connected between the base of the NPN transistor 18 and the collector of the NPN transistor 19.

The operation of the system will be described below. If the voltage of the input signal from the input signal power source 6 is $V_I$, the resistance value of the input resistor 10 is $R_I$, the resistance value of the feedback resistor 11 is $R_F$, then an output voltage $V_O$ of the operational amplifier 9 is expressed by the following equation:

$$V_0 = -\left(V_I \frac{R_F}{R_I}\right) + V_R\left(1 + \frac{R_F}{R_I}\right) \quad (1)$$

Since the output terminal of the amplifier circuit 5 is connected to the output terminal of the operational amplifier 9, the output from the amplifier circuit 5 is $V_O$ expressed by the equation (1).

If the impedance of the load 8 is $Z_L$, a current $I_O$ which flows into the operational amplifier 9 through the output terminal 7 is $$I_0 = \frac{V_{CC} - V_0}{Z_L} \quad (2)$$

and, if the current in the constant-current source 20 is $I_R$, the collector current $I_{C19}$ in the NPN transistor 19 is $$I_{C19} = I_0 + I_R \quad (3)$$

If the resistance value of the resistor 21 is $R_O$, a saturated collector-emitter voltage of the NPN transistor is $V_S$, a minimum value $V_{OL}$ of the output voltage is $$V_{OL} = I_O R_O + V_S \quad (4)$$

When the minimum value $V_{OL}$ is expressed by equation (4), the current flowing in through the output terminal 7 is maximized. The maximum value $I_O(max)$ of the current I is expressed by the following equation obtained by substituting equation (4) in equation (2):

$$I_{O(max)} = \frac{1}{Z_L + R_0}(V_{CC} - V_S) \quad (5)$$

As can be understood from equation (5), it is desirable to reduce $R_O$ when a larger value of $I_O(max)$ is required. Also, as can be understood from equation (4), $V_{OL}$ becomes smaller an the output range (dynamic range) of the operational amplifier 9 extends, if $R_O$ is reduced.

For example, when $V_{CC}=5$ V, $V_S=0.3$ V and $I_O(max)=2$ mA are set, $R_O=100\Omega$ and $Z_L=2.25$ k$\Omega$ if $V_{OL}=0.5$ V.

In the above-described circuit, if a portion of the output terminal 7 is short-circuited to ground 2 by, for example, a connector failure as indicated by a broken line a in FIG. 7, a current $I_{SG}$ caused to flow to ground 2 by the short circuit is expressed by the following equation:

$$I_{SG} = \frac{V_{CC}}{Z_L} + I_R \quad (6)$$

Accordingly, if $I_R=0.5$ mA, $I_{SG}=2.7$ mA. In this case, there is no possibility of a particular circuit failure, such as a breakdown in stabilized power supply circuit 3 or amplifier circuit 5.

Then, if a portion of the output terminal 7 is short-circuited to $V_{CC}$ 4 as indicated by a broken line b in FIG. 7, a current $I_{SV}$ caused by the short circuit is a smaller one of two values determined by the following equations:

$$I_{SV} = \frac{V_{CC}}{R_0} \quad (7)$$

or $$I_{SV} = I_{15} \times \beta_1 \times \beta_2 \quad (8)$$

where $I_{15}$ is the current in the constant-current source 15, $\beta_1$ is a direct current amplification factor of the NPN transistor 8 and $\beta_2$ is a direct current amplification factor of the NPN transistor 19.

If $V_{CC}=5$ V, $R_O=100\Omega$, $I_{15}=5$ $\mu$A, and $\beta_1=\beta_2=100$, then $I_{SV}=50$ mA from equation (7), and $I_{SV}=50$ mA from equation (8). Consequently, $I_{SV}=50$ mA (since the values of equations (7) and (8) are equal to each other in this case).

Thus, it is possible that a short circuit between the output terminal 7 and the power supply line ($V_{CC}$ 4), such as that as indicated by the line b in FIG. 7, causes a current which is ten times or more greater than a current caused by a short circuit to ground 2 indicated at a, and which may cause a breakdown in the amplifier circuit 5.

Ordinarily, an output current limiting circuit is incorporated in the stabilized power supply circuit 3 to protect the same. The limited output current value is changed according to the scale of the circuit connected to the stabilized power supply circuit 3. For example, in the case of a short-circuit as indicated by the line b in FIG. 7, $V_{CC}=3$ V, if the current $I_{SV}$, which is determined by the smaller one of the values obtained by equations (7) and (8), i.e., the value of equation (7) in this case, is limited to $I_{SV}=V_{CC}/R_O=30$ mA.

That is, in the case of the short circuit indicated by the line b in FIG. 7, the voltage $V_{CC}$ is reduced from 5 V to 3 V. In this case, the output voltage of the amplifier circuit 5 is equal to $V_{CC}$, i.e., 3 V. The voltage of 3 V is also output when the amplifier circuit 5 is operating normally. From this output voltage, it appears that the output from the amplifier circuit 5 is normal even though the state is even though abnormal, that is, there is a short circuit between $V_{CC}$ 4 and the output terminal 7 of the amplifier circuit 5. In such a situation, there is a possibility of occurrence of a serious failure in a system (not shown) using the output terminal 7 (runaway may occur if a certain feed back is used). Ordinarily, with a microcomputer control or the like, the voltage at the output terminal of the amplifier circuit 5 is not increased to the level of $V_{CC}$ 4. Therefore, the output terminal 7 of the amplifier circuit may be regarded as an error voltage not to be referred to if, for example, it is 4.5 V or higher. In the situation discussed here, however, the output voltage at the output terminal 7 is 3 V and such an error detection cannot be expected.

As described above, if the output from the conventional amplifier circuit is short-circuited to a power supply voltage $V_{CC}$, which is an output from a stabilized power supply circuit, an excessively large current flows and damages the amplifier circuit, or the output voltage $V_{CC}$ of the stabilized power supply circuit is reduced to cause a serious failure in a system which is connected to the output terminal of the amplifier circuit. Thus, the conventional amplifier is unsatisfactory in terms of reliability.

SUMMARY OF THE INVENTION

In view of the above-described problem, an object of the present invention is to provide an amplifier circuit having a function of protecting itself and preventing a serious failure in a system controlled by the amplifier circuit even when the output terminal of the amplifier circuit is short-circuited to the output $V_{CC}$ from a stabilized power supply circuit which is a power source for the amplifier circuit.

In order to achieve the above object, according to one aspect of the present invention, there is provided an amplifier circuit using a stabilized power supply circuit as a power source, the amplifier circuit comprising an operational amplifier, the operational amplifier having an output section including a transistor in a common-emitter circuit configuration and an output terminal which is connected to a collector of the transistor and through which an output from the amplifier circuit is obtained, an output drive section for driving the transistor in the common-emitter circuit configuration in the output section, a current limiter section connected to at least one of the output section and the output drive section, the current limiter section limiting a current so that a collector current of the transistor in the common-emitter configuration in the output section does not exceed a predetermined current, and an input section having an output connected to the output drive section, wherein when the output from the amplifier circuit is short-circuited to a power supply line, current is limited so that the collector current of the transistor in the common-emitter configuration does not exceed the predetermined current value, and an output from the stabilized power supply circuit is stably maintained at a predetermined voltage.

According to another aspect of the present invention, there is provided an amplifier circuit using a stabilized power supply circuit as a power source, the amplifier circuit comprising an operational amplifier, the operational amplifier having an output section having a transistor in a common-emitter circuit configuration and an output connected to a collector of the transistor, an output drive section for driving the transistor in the common-emitter circuit configuration in the output section, a current limiter section connected to at least one of the output section and the output drive section, the current limiter section limiting a current so that a collector current of the transistor in the common-emitter configuration in the output section does not exceed a predetermined current value, an input section having an output connected to the output drive section, and auxiliary output means supplied with the output from the output section, the auxiliary output means including a push-pull amplifier circuit section, a second current limiter section for limiting a current flowing through the push-pull amplifier circuit section, and an output terminal which is controlled with the push-pull amplifier and the second current limiter section and through which an output from the amplifier circuit is obtained, wherein even when the output from the amplifier circuit is short-circuited to one of a power supply line and a ground, current is limited so that the current in the push-pull amplifier circuit section does not exceed a predetermined current, and an output from the stabilized power supply circuit is stably maintained at a predetermined voltage.

In amplifier circuit in the first aspect of the invention, the current in the transistor in the common-emitter configuration in the output section is limited by the current limiter section connected to at least one of the output section and the output drive section for driving the output section to prevent flow of an excessively large current even when the output is short-circuited to the power supply $V_{CC}$. The transistor in the common-emitter configuration in the output section and the stabilized power supply circuit are thereby prevented from being damaged, while a reduction in the output from the stabilized power supply circuit is prevented, thereby avoiding any influence upon other circuits.

The amplifier circuit in the second aspect of the invention is further provided with an auxiliary output means which is supplied with the output from the output section, and which includes a push-pull amplifier circuit section, a second current limiter section for limiting a current flowing through the push-pull amplifier circuit section, and an output terminal which is controlled with the push-pull amplifier and the second current limiter section and through which an output from the amplifier circuit is obtained is further provided. It is thereby possible to prevent damage to the auxiliary output means and the stabilized power supply circuit as well as to prevent a reduction in the output from the stabilized power supply circuit and, hence, any influence upon other circuits, even when the output from the amplifier circuit is short-circuited to the power supply $V_{CC}$ or the ground.

DESCRIPTION OF THE PREFERRED EMBODIMENTS

Embodiment 1

Figure 1:
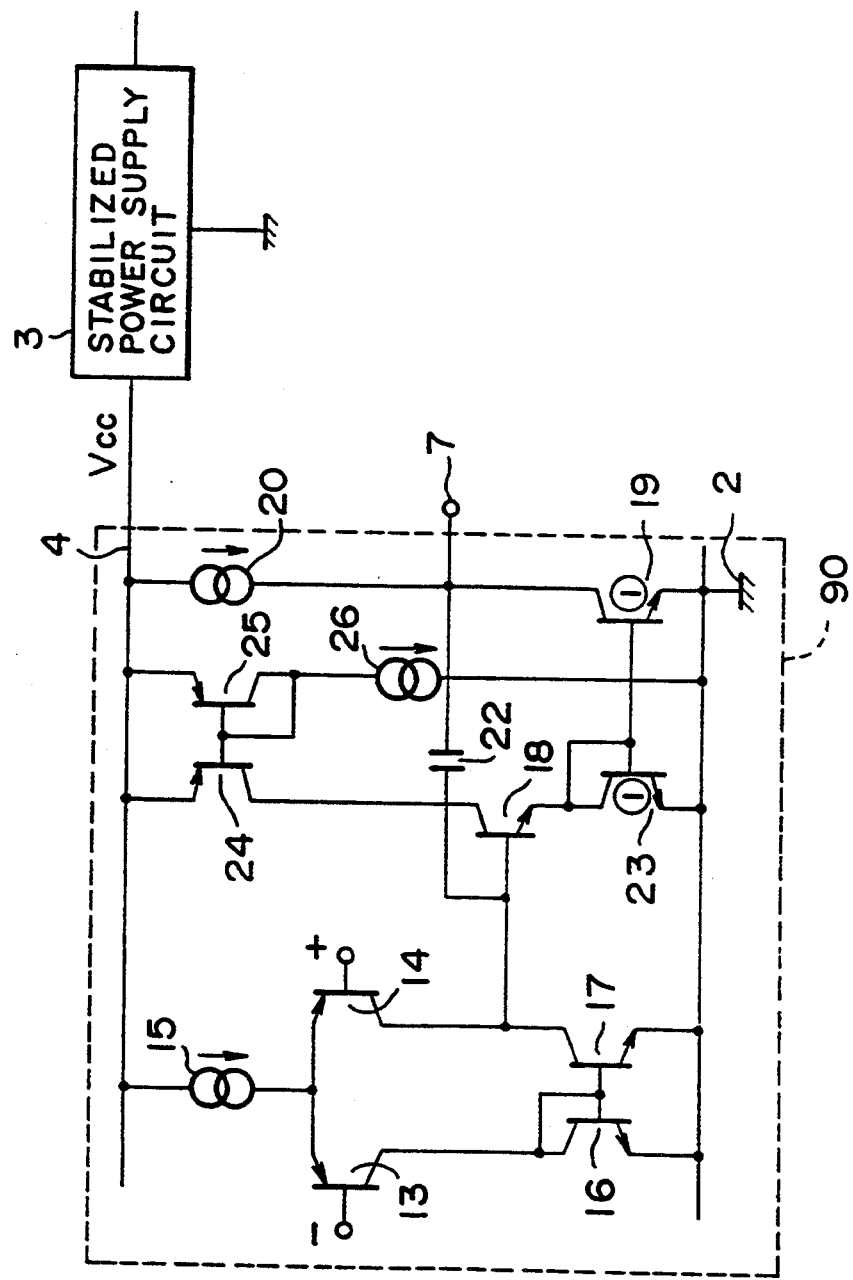
FIG. 1 is a circuit diagram of an operational amplifier in an amplifier circuit in accordance with an embodiment of the present invention.
Figure 7:
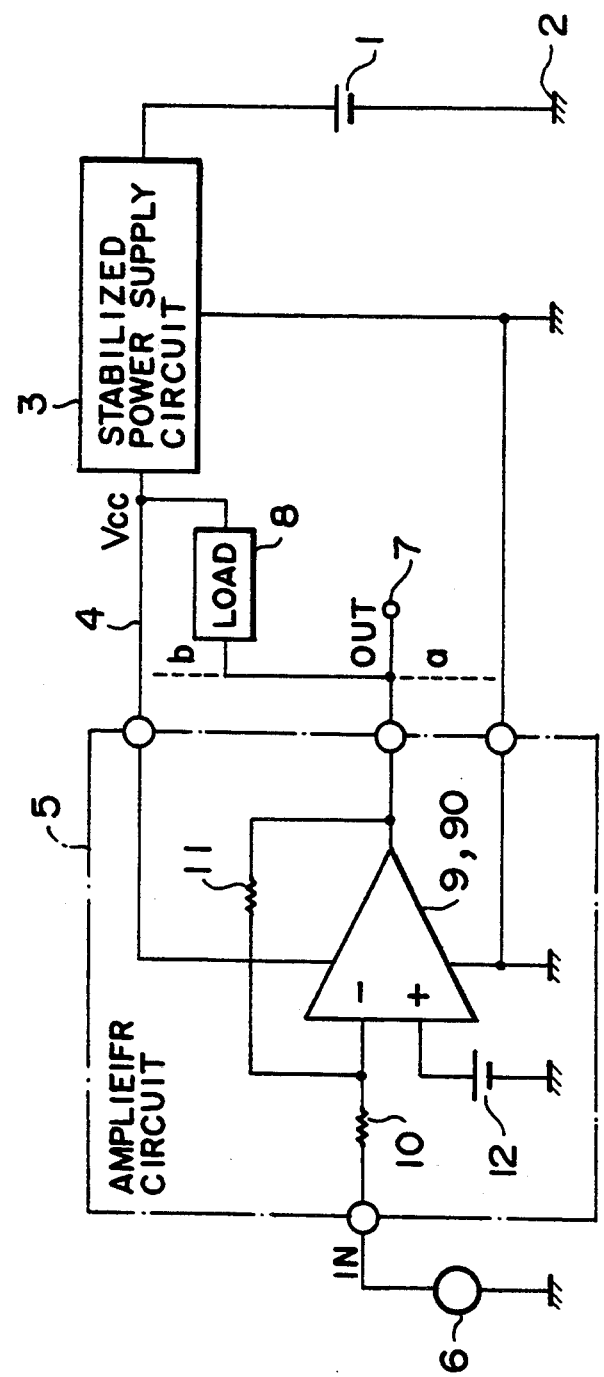
FIG. 7 is a schematic block diagram of the configuration of a circuit system including an amplifier circuit.
Figure 8:
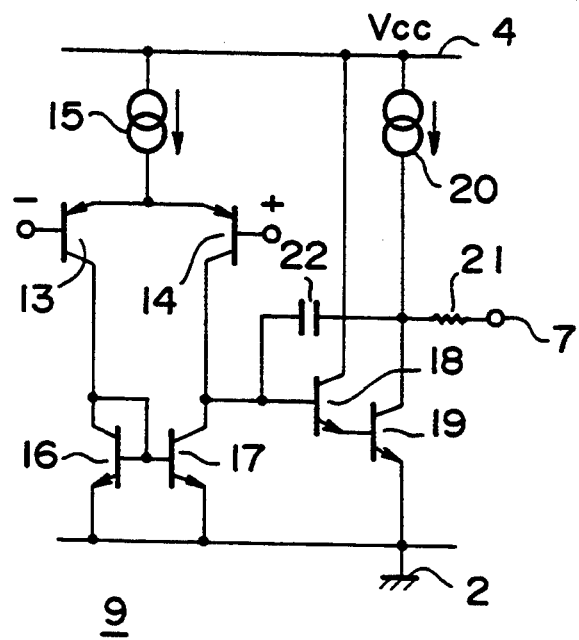
FIG. 8 is a circuit diagram of an operational amplifier of a conventional amplifier circuit.

An amplifier circuit of a first embodiment of the present invention is described below with reference to FIG. 1. The configuration of the entire circuit system including the amplifier circuit of this embodiment is the same as that shown in FIG. 7. FIG. 1 is a circuit diagram of an operational amplifier 90 of this embodiment corresponding to the operational amplifier shown in FIG. 7. Components identical or corresponding to those of the conventional arrangement are indicated by the same reference characters and the description of them will not be repeated. An NPN transistor 23 has its base and collector connected to the emitter of an NPN transistor 18 and its emitter connected to ground 2. A PNP transistor 24 has its collector connected to the collector of the NPN transistor 18 and its emitter connected to $V_{CC}$ 4. A PNP transistor 25 has its base and collector connected to the base of the PNP transistor 24 and its emitter connected to $V_{CC}$ 4. A constant-current source 26 is connected between the base and the collector of the transistor 25 and ground 2.

An NPN transistor 19 and a constant current source 20 constitute an output section. The NPN transistor 18 constitutes an output driver section. The NPN transistor 23, the PNP transistors 24 and 25 and the constant-current source 26 constitute a current limiter section. PNP transistors 13 and 14, a constant-current source 15 and NPN transistors 16 and 17 constitute an input section, i.e., a differential amplifier section in this circuit.

The operation of this embodiment will be described below with reference to FIG. 1. When the circuit is operating normally, the collector current $I_{C19}$ of the NPN transistor 19 is expressed by the following equation from equations (2) and (3):

$$I_{C19} = \frac{V_{CC} - V_0}{Z_L} + I_R \qquad (9)$$

If the NPN transistors 19 and 23 have 1:1, i.e., equal emitter areas as shown, the emitter current $I_{E19}$ of the NPN transistor 19 and the emitter current $I_{E23}$ of the NPN transistor 23 are equal to each other.

Accordingly, if the direct current amplification factors of the NPN transistors 19 and 23 are sufficiently large, the collector current $I_{C19}$ of the NPN transistor 19 and the collector current $I_{C23}$ of the NPN transistor 23 are also equal to each other. Also, the collector current $I_{C23}$ of the NPN transistor 23 is equal to the collector current $I_{C18}$ of the NPN transistor 18.

The collector current $IC_{24}$ of the PNP transistor 24 is equal to the collector current of the NPN transistor 18.

The above-described relationship is expressed by the following equation:

$$I_{C19} = \frac{V_{CC} - V_0}{Z_L} + I_R = I_{C23} = I_{C18} = I_{C24} \quad (10)$$

Since the base-emitter voltage of the NPN transistor 24 is equal to the base-emitter voltage of the PNP transistor 25, the collector current $I_{C24}$ of the PNP transistor 24 and the collector current $I_{C25}$ of the PNP transistor 25 must be equal to each other provided that the PNP transistor 24 is operating substantially in an active range. However, if the current $I_{R1}$ of the constant-current source 26 is increased significantly relative to the collector current $I_{C19}$ of the NPN transistor 19 that is ordinarily required, $$I_{C24} < I_{C25} = I_{R1} \quad (11)$$

is established.

This indicates that the PNP transistor 24 is operating in a saturated range. That is, the PNP transistor 24 changes its current in response to $I_{C19}$ below an upper limit corresponding to $I_{R1}$.

If the output terminal 7 is short-circuited to $V_{CC}$ 4, the state of the circuit is changed as described below. First, the base potential of the PNP transistor 13 becomes higher than the base potential of the PNP transistor 14 so that the PNP transistor 14 is saturated and the PNP transistor 13 is switched off. Accordingly, the current $I_{15}$ of the constant-current source 15 flows entirely through the PNP transistor 14 from the emitter to the collector thereof to be input to the base of the NPN transistor 18. The NPN transistor 18 is saturated and the collector current $I_{C18}$ of the NPN transistor 18 is as represented by the following equation:

$$I_{C18} = I_{C24} = I_{C25} = I_{R1} \quad (12)$$

That is, the collector current $I_{C18}$ of the NPN transistor 18 is limited by the current $I_{R1}$ of the constant-current source 26. Also, the collector current $I_{C23}$ of the NPN transistor 23 and the collector current $I_{C18}$ of the NPN transistor 18 are equal to each other, and are also equal to the collector current $I_{C19}$ of the NPN transistor 19, and $$I_{R1} = I_{C18} = I_{C23} = I_{C19} \quad (13)$$

is established.

The collector current $I_{C19}$ of the NPN transistor 19 is therefore limited by the current $I_{R1}$ of the constant current circuit 26. For example, if $I_{R1}$ is set to 3 mA, $I_{SV}=2.9$ mA (while $I_R=0.1$ mA). Under this condition, there is no possibility of damage to the amplifier circuit 5 or an excessively large current being drawn from the stabilized power supply circuit 3 to cause a reduction in the voltage $V_{CC}$ 4. Therefore, the voltage of the output terminal 7 is fixed at the voltage $V_{CC}$ 4 (e.g., 5 V) and the abnormality can be detected in a system using the output from the output terminal 7. The same effect can also be achieved in the other embodiments of the invention described later.

That is, in the amplifier circuit 5 of Embodiment 1 using the stabilized power supply circuit 3 as a power source, an output section of the operational amplifier 90 of the amplifier circuit 5 is formed by a common-emitter circuit of the transistor 19; the collector and the base of the transistor 23 having the same polarity as the transistor 19 forming the common emitter circuit are connected to each other; the point of connection between the collector and the base of the transistor 23 is connected to the base of the transistor 19; the emitter of the transistor 19 is connected to the emitter of the transistor 23 having its collector and base connected to each other; the emitter of the transistor 18 forming an emitter-follower circuit is connected to the point of connection between the collector and the base of the transistor 23; and a current limiter circuit (23, 24, 25, 26) is connected to the collector of the transistor 18 forming the emitter-follower circuit. The current limiter circuit (23, 24, 25, 26) inhibits the collector current of the transistor 19 forming the common-emitter circuit from exceeding a predetermined current value (if the collector of the transistor 19, i.e., the output terminal 7 of the amplifier circuit) is short-circuited to the power supply $V_{CC}$ (or ground 2). It is thereby possible to prevent damage to the transistor 19 forming the common-emitter circuit and the stabilized power supply circuit 3 and to stably maintain the output from the stabilized power supply circuit 3 at a predetermined voltage.

Embodiment 2

Figure 2:
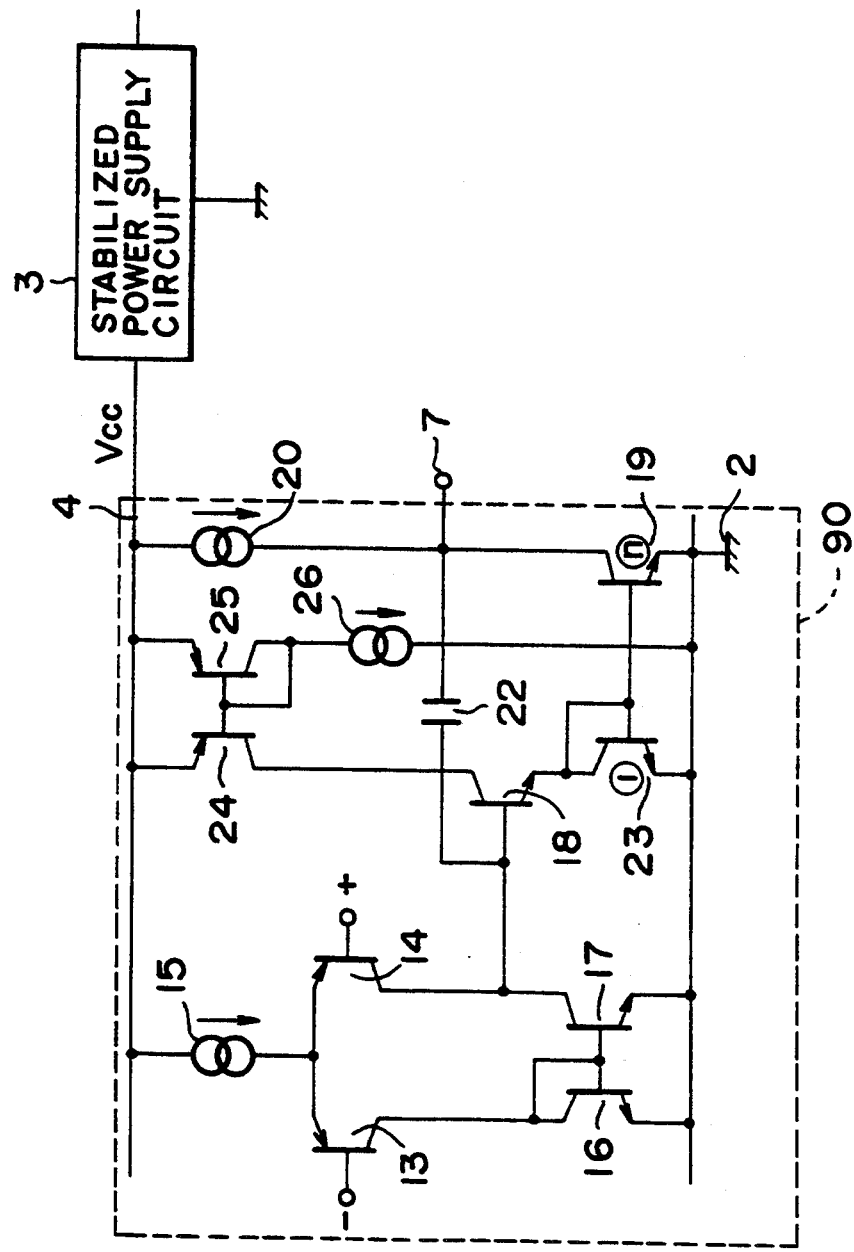
FIG. 2 is a circuit diagram of an operational amplifier in an amplifier circuit in accordance with another embodiment of the present invention.

FIG. 2 is a circuit diagram of an operational amplifier in accordance with a second embodiment of the present invention. In Embodiment 1, the emitter areas of the NPN transistors 19 and 23 are equal to each other. In this embodiment, the emitter area $S_{E19}$ of the NPN transistor 19 and the emitter area $S_{E23}$ of the NPN transistor 23 are in the following ratio:

$$S_{E19}:S_{E23}=n:1 \quad (14)$$

Then, equation (13) is rewritten as shown below.

$$I_{R1} = I_{C18} = I_{C23} = \frac{I_{C19}}{n} \quad (15)$$

Accordingly, if the collector current $I_{C19}$ of the NPN transistor 19 when the output terminal 7 is short-circuited to $V_{CC}$ 4 is 3 mA, $I_{R1}=0.3$ mA may suffice and the total circuit current $I_{CC}$ can therefore be reduced.

That is, in the amplifier circuit 5 of Embodiment 2 using the stabilized power supply circuit 3 as a power source, an output section of the operational amplifier 90 of the amplifier circuit 5 is formed by a common-emitter circuit of the transistor 19; the collector and the base of the transistor 23 having the same polarity as that of the transistor 19 forming the common-emitter circuit and having an emitter area 1/n that of the transistor 19 are connected to each other; the point of connection between the collector and the base of the transistor 23 is connected to the base of the transistor 19; the emitter of the transistor 19 is connected to the emitter of the transistor 23 having its collector and base connected to each other; the emitter of the transistor 18 forming an emitter-follower circuit is connected to the point of connection between the collector and the base of the transistor 23; and a current limiter circuit (23, 24, 25, 26) is connected to the collector of the transistor 18 forming the emitter-follower circuit. The current limiter circuit (23, 24, 25, 26) inhibits the collector current of the transistor 19 forming the common-emitter circuit from exceeding a predetermined current, if the collector of the transistor 19, i.e., the output terminal 7 of the amplifier circuit is short-circuited to the power supply $V_{CC}$ (or ground 2). An effect of reducing the total circuit current $I_{CC}$ can be thereby achieved as well as the effects of Embodiment 1.

Embodiment 3

Figure 3:
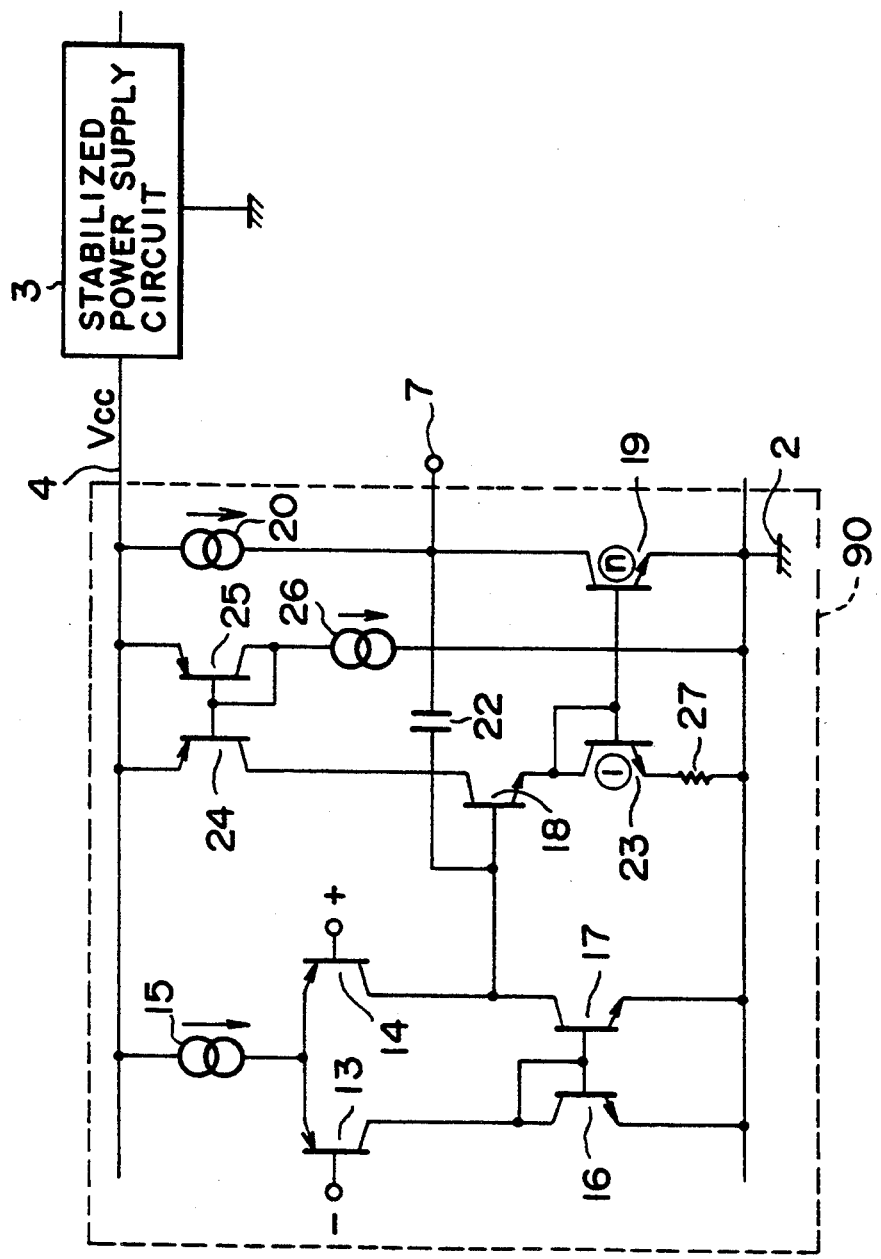
FIG. 3 is a circuit diagram of an operational amplifier in an amplifier circuit in accordance with a further embodiment of the present invention.

FIG. 3 is a circuit diagram of an operational amplifier in accordance with a further embodiment of the present invention. In this embodiment, a resistor 27 is added to the circuit of Embodiment 2 shown in FIG. 2 and is connected to the emitter of the NPN transistor 23 and ground 2. When the output terminal 7 is short-circuited to $V_{CC}$4, the collector current $I_{C19}$ of the NPN transistor 19 and the collector current $I_{C23}$ of the NPN transistor 23 are in the following relationship:

$$\frac{kT}{q} \ln \frac{I_{C19}}{I_{S19}} = I_{C23}R_{27} + \frac{kT}{q} \ln \frac{I_{C23}}{I_{S23}} \quad (16)$$

where q is the electronic charge, k is Boltzmann's constant, T is absolute temperature, and R27 is the resistance value of resistor 27.

Since the emitter area ratio of the NPN transistors 19 and 23 is n:1, $$I_{S19}:I_{S23} = n:1 \quad (17)$$

From equations (16) and (17), $$\frac{kT}{q} \ln \left( \frac{1}{n} \cdot \frac{I_{C19}}{I_{C23}} \right) = I_{C23}R_{27} \quad (18)$$

Accordingly, R27 is 285 Ω when $I_{C23}$ (=IR1)=0.1 mA, $I_{C19}$=3 mA and n=10.

The total circuit current $I_{CC}$ can be further reduced by inserting the resistor 27 between the emitter of the NPN transistor 23 and the ground. Actually, the resistance value R27 is slightly larger because of the influence of the base current of the NPN transistor 19. The resistor 27 is included in a current limiter section.

That is, in the amplifier circuit 5 of Embodiment 3 using the stabilized power supply circuit 3 as a power source, an output section of the operational amplifier 90 of the amplifier circuit 5 is formed by a common-emitter circuit of the transistor 19; the collector and the base of the transistor 23 having the same polarity as that of the transistor 19 forming the common-emitter circuit and having an emitter area 1/n that of the transistor 19 are connected to each other; the point of connection between the collector and the base of the transistor 23 is connected to the base of the transistor 19; one terminal of the resistor 27 is connected to the emitter of the transistor 23 having its collector and base connected to each other; the other terminal of the resistor 27 is connected to the emitter of the transistor 19; the emitter of the transistor 18 forming an emitter-follower circuit is connected to the point of connection between the collector and the base of the transistor 23; and a current limiter circuit (23, 24, 25, 26, 27) is connected to the collector of the transistor 18 forming the emitter-follower circuit. The current limiter circuit (23, 24, 25, 26, 27) inhibits the collector current of the transistor 19 forming the common-emitter circuit from exceeding a predetermined current, if the collector of the transistor 19, i.e., the output terminal 7 of the amplifier circuit, is short-circuited to the power supply $V_{CC}$ (or ground 2). An effect of further reducing the total circuit current $I_{CC}$ can be thereby achieved as well as the effects of Embodiment 2.

Embodiment 4

Figure 4:
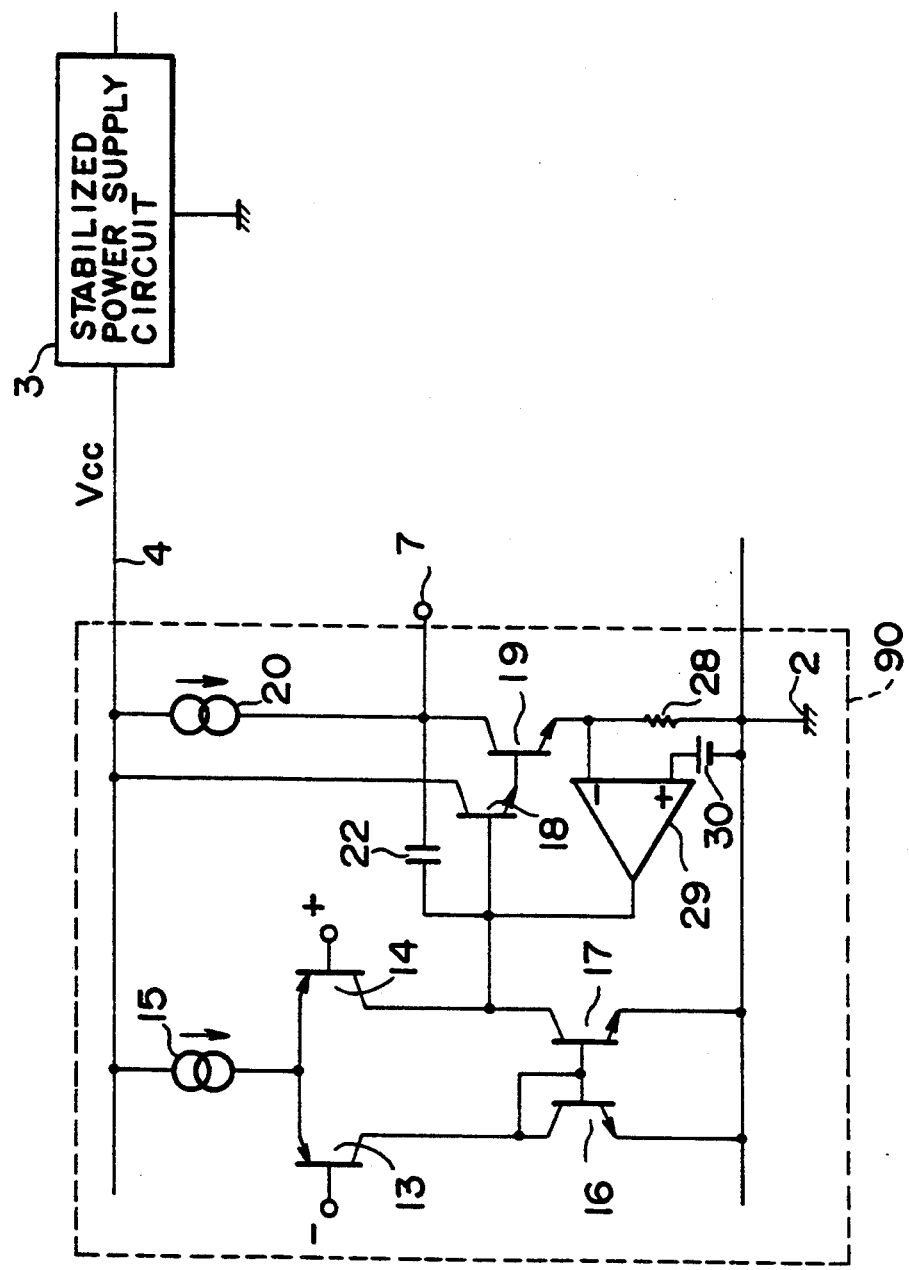
FIG. 4 is a circuit diagram of an operational amplifier in an amplifier circuit in accordance with a further embodiment of the present invention.

FIG. 4 is a circuit diagram of an operational amplifier in accordance with a further embodiment of the present invention in the first aspect. In the embodiment shown in FIG. 4, a resistor 28, a differential amplifier (second differential amplifier circuit) 29 and a second reference power source 30 constitute a current limiter section. In this circuit, the resistor 28 is connected between the emitter of the NPN transistor 19 and ground 2, a voltage drop across the resistor 28 is supplied to an inverting input terminal of the differential amplifier (second differential amplifier circuit) 29, and the voltage of the second reference power source 30 is supplied to a non-inverting input terminal of the differential amplifier 29. When the current flowing in the NPN transistor 19 is increased so that the voltage drop across the resistor 28 becomes equal to the voltage of the second reference power source 30, the base current of the NPN transistor 18 is controlled by the differential amplifier 29 to limit the current.

For example, if $I_{C19}$=3 mA, the resistance value of the resistor 28 is 30Ω, the voltage of the second reference power source 30 may be set to 90 mV.

This embodiment has a feedback system in which the emitter current of the NPN transistor is directly detected and fed back, and is therefore advantageous in that the limiter control is not influenced by variations in the direct current amplification factor. Since the Early effect of the transistor has high current limiting accuracy in this circuit is therefore high. Such a feedback control is not ordinarily required for this kind of protection or error prevention. However, it is effective in a case where high limited current accuracy is required.

That is, in the amplifier circuit 5 of Embodiment 4 using the stabilized power supply circuit 3 as a power source, an output section of the operational amplifier 90 of the amplifier circuit 5 is formed by a common-emitter circuit of the transistor 19; the resistor 28 is connected between the emitter of the transistor 19 forming the common-emitter circuit and the ground; the point of connection between the resistor 28 and the emitter of the transistor 19 is connected to one of the two input terminals of the differential amplifier circuit 29; the second reference power source 30 for generating a constant voltage is connected to the other input terminal of the differential amplifier 29;,and the base current of the transistor 18 forming an emitter-follower circuit is controlled by the output from the differential amplifier 29. The collector current of the transistor 19 forming the common-emitter circuit is limited by the resistor 28, the differential amplifier 29 and the second reference power source 30, if the collector of the transistor 19, i.e., the output terminal 7 of the amplifier circuit is short-circuited to the power supply $V_{CC}$ (or ground 2). It is thereby possible to prevent damage to the transistor 19 forming the common-emitter circuit and the stabilized power supply circuit 3 and to stably maintain the output from the stabilized power supply circuit 3 at a predetermined voltage, as in the case of Embodiment 1. Also, this embodiment is characterized by particularly high limited current accuracy.

Embodiment 5

Figure 5:
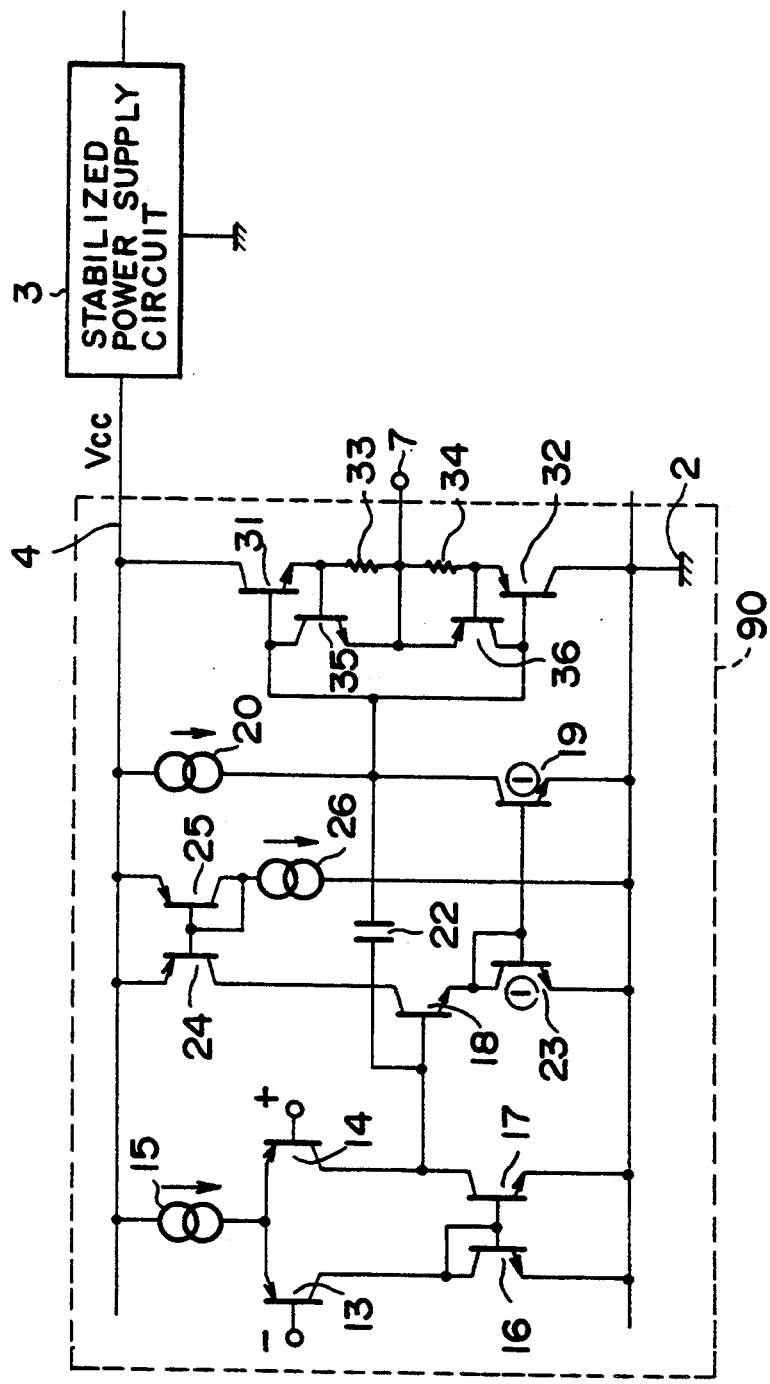
FIG. 5 is a circuit diagram of an operational amplifier in an amplifier circuit in accordance with a further embodiment of the present invention.
Figure 6:
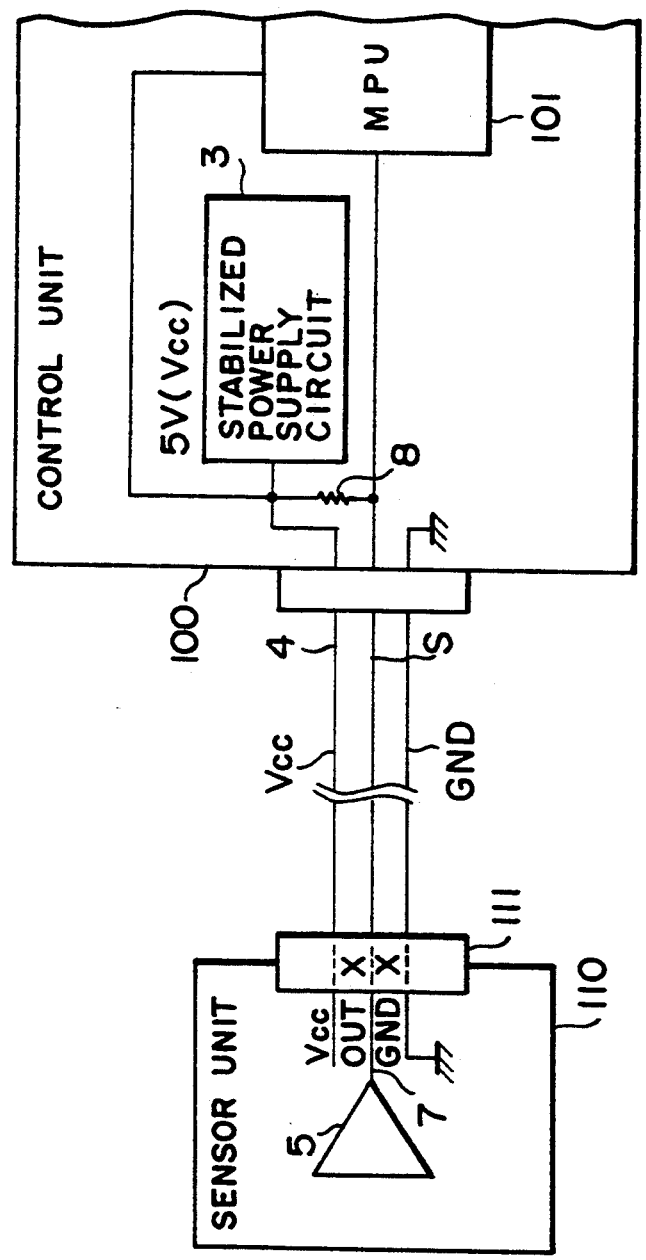
FIG. 6 is a block diagram of an example of a system including an amplifier circuit.

FIG. 5 is a circuit diagram of an operational amplifier in an amplifier circuit in accordance with an embodiment of the present invention. The circuit shown in FIG. 5 is formed by adding an auxiliary output means including components 31 to 36 to the circuit shown in FIG. 1. In this operational amplifier, an NPN transistor 31, a PNP transistor 32 and resistors 33 and 34 constitute a push-pull amplifier circuit section, and an NPN transistor 35 and a PNP transistor 36 constitute a second current limiter section.

The bases of the NPN transistor and the PNP transistor 32 are connected to the collector of the NPN transistor 19. The collector of the NPN transistor 31 is connected to $V_{CC}$ 4, and the collector of the PNP transistor 32 is connected to ground 2. The resistor 33 is connected between the emitter of the NPN transistor 31 and the output terminal 7, and the resistor 34 is connected between the PNP transistor 32 and the output terminal 7. Further, the collector of the NPN transistor 35 is connected to the base of the NPN transistor 31, the collector of the PNP transistor 36 to the base of the PNP transistor 32, the base of the NPN transistor 35 to the emitter of the NPN transistor 31, and the base of the PNP transistor 36 to the emitter of the PNP transistor 32. The emitters of the NPN transistor 35 and the PNP transistor 36 are connected in common to the output terminal 7.

In this circuit, if the output terminal 7 is short-circuited to ground 2, the base current of the NPN transistor 31 diverges through the collector of the NPN transistor 35 limiting the collector current $I_{C31}$ of the NPN transistor 31 when the product of the collector current $I_{C31}$ of the NPN transistor 31 and the resistance value R33 of the resistor 33 becomes equal to a base-emitter on voltage $V_{BE35}$ of the NPN transistor 35.

$$I_{C31} \leq \frac{V_{BE35}}{R_{33}} \quad (19)$$

That is, when $V_{BE35}=0.65$ V and R33=217Ω, collector current $I_{C31}$ of the NPN transistor 31 is limited to 3 mA.

Similarly, with respect to a short circuit between the output terminal 7 and $V_{CC}$ 4, the relationship between the collector current $I_{C32}$ of the PNP transistor 32, the resistance value R34 of the resistor 34 and the base-emitter on voltage $V_{BE36}$ of the PNP transistor 36 is $$I_{C32} \leq \frac{V_{BE36}}{R_{34}} \quad (20)$$

and the collector current $I_{C32}$ of the PNP transistor 32 is limited to 3 mA when $V_{BE}=0.65$ V and R34=217Ω.

In this case, however, the collector current of the NPN transistor 19 is to be limited and it is limited by the current limiter section consisting of the NPN transistor 23, the PNP transistors 24 and 25 and the constant-current source 26.

That is, in the amplifier circuit 5 of Embodiment 5 using the stabilized power supply circuit 3 as a power source, an output section of the operational amplifier 90 of the amplifier circuit 5 is formed by a push-pull amplification circuit having the NPN transistor 31 and the PNP transistor 32 in the emitter-follower circuit configuration; the resistor 33 is connected between the emitter of the NPN transistor 31 and the output terminal 7; the resistor 34 is connected between the emitter of the PNP transistor 32 and the output terminal 7; and the current limiting NPN transistor 35 having its collector and base connected to the base and emitter of the NPN transistor 31, respectively, and the current limiting PNP transistor 36 having its collector and base connected to the base and emitter of the transistor 32, respectively, are provided. The push-pull amplification circuit of the NPN transistor 31 and the PNP transistor 32 is driven with a common emitter circuit of the transistor 19, and the point of connection between the collector and base of the transistor 23 having the same polarity as that of the transistor 19 forming the common-emitter circuit is connected to the base of the transistor 19. The emitter of the transistor 23 having the collector and base connected to each other is connected to the emitter of the transistor 19, the emitter of the transistor 18 forming an emitter-follower circuit is connected to the point of connection between the collector and base of the transistor 23, and the current limiter circuit (23, 24, 25, and 26) is connected to the collector of the transistor 18 forming the emitter-follower circuit. The current limiting PNP transistor 36 or the current limiting NPN transistor 35 limits a current in the push-pull circuit of the NPN transistor 31 and the PNP transistor 32, if the output terminal 7 of the amplifier circuit 5 is short-circuited to either one of the power supply $V_{CC}$ and ground 2. It is thereby possible to prevent damage to the push-pull amplification circuit of the NPN transistor 31 and the PNP transistor 32 and the stabilized power supply circuit 3 and to stably maintain the output from the stabilized power supply circuit at a predetermined voltage.

While substantially no problem is encountered in Embodiments 1 to 4 when a short circuit between the output and the ground occurs, this Embodiment 5 is arranged to protect the circuit more positively from this kind of short circuit.

The constant-current source 20 provided in each of the above-described embodiments may be replaced with a resistor. The differential amplifier circuit in the input section may be formed by using NPN transistors in place of the PNP transistors 13 and 14. Needless to say, the function of the input section may be obtained without using a differential amplifier circuit. The present invention is not limited to semiconductor amplifier circuits, although it may generally be applied to such circuits.

In the first aspect of the present invention, as described above, a current limiter section is provided to limit a current flowing into a transistor in an output section of an amplifier circuit, whereby occurrence of an excessively large current is prevented and the amplifier circuit and the stabilized power supply circuit used as a power source for the amplifier circuit are prevented from being damaged even when the output terminal of the amplifier circuit is short-circuited to the power supply $V_{CC}$. Also, in such a situation, a reduction in the output voltage of the stabilized power supply circuit can be prevented and an abnormality due to the short-circuit failure can be distinguished from use of the output from the amplifier circuit. Thus, an amplifier circuit having improved reliability can be provided.

In a second aspect of the present invention, an auxiliary output means including a push-pull amplifier circuit section and a second current limiter section for limiting current in this circuit is provided in the circuit according to the first aspect of the invention. An amplifier circuit having very high reliability can be thereby achieved in which occurrence of an excessively large current is prevented when the output terminal of the amplifier circuit is short-circuited to either one of the power supply $V_{CC}$ and the ground.

What is claimed is:

1. An amplifier circuit using a stabilized power supply circuit as a power source, said amplifier circuit comprising an operational amplifier, said operational amplifier having:

an output section including a first transistor having an emitter, a base, and a collector and connected in a common-emitter circuit configuration, an output terminal connected to the collector of the first transistor and through which an output from the amplifier circuit is obtained;

an output drive section for driving the first transistor connected in the common-emitter circuit configuration in said output section;

a current limiter connected to at least one of said output section and said output drive section, said current limiter limiting current flow so that a collector current of the first transistor connected in the common-emitter configuration in said output section does not exceed a maximum current, said current limiter section including a second transistor having the same polarity as the first transistor, the second transistor having a collector and a base connected to each other and connected to the base of the first transistor, the second transistor having an emitter connected to the emitter of the first transistor; and an input section having an output connected to said output drive section wherein said output drive section includes a third transistor connected in an emitter-follower configuration and having an emitter connected to the collector and the base of the second transistor, having a collector connected to said current limiter section, and having a base connected to the output from the input section so that, when the output from the amplifier circuit is short-circuited to a power supply line, current flow is limited so that the collector current of the first transistor connected in the common-emitter configuration does not exceed the maximum current, and an output from the stabilized power supply circuit is stably maintained at a predetermined voltage.

2. The amplifier circuit according to claim 1 wherein the first and second transistors have respective emitter areas and the emitter area of the second transistor of said current limiter is 1/n the emitter area of the first transistor, where n is an integer, to reduce overall circuit current.

3. The amplifier circuit according to claim 2 wherein said current limiter includes a resistor connected between the emitter of the second transistor and a ground to further reduce the overall circuit current.

4. An amplifier circuit using a stabilized power supply circuit as a power source, said amplifier circuit comprising an operational amplifier, said operational amplifier having:

an output section including a first transistor having an emitter, a base, and a collector and connected in a common-emitter circuit configuration and an output connected to the collector of the first transistor;

an output drive section for driving the first transistor connected in the common-emitter circuit configuration in said output section;

a first current limiter connected to at least one of said output section and said output drive section, said first current limiter limiting current flow so that a collector current of the first transistor connected in the common-emitter configuration in said output section does not exceed a maximum current, said first current limiter including a second transistor having the same polarity as the first transistor, the second transistor having a collector and a base connected to each other and connected to the base of the first transistor, the second transistor having an emitter connected to the emitter of the first transistor;

an input section having an output connected to said output drive section, said output drive section including a third transistor connected in an emitter-follower configuration and having an emitter connected to the collector and the base of the second transistor, the third transistor having a collector connected to said first current limiter and a base connected to the output from said input section; and auxiliary output means supplied with the output from said output section, said auxiliary output means including a push-pull amplifier circuit, a second current limiter for limiting a current flowing through the push-pull amplifier circuit, and an output terminal controlled by the push-pull amplifier circuit and the second current limiter and through which an output from the amplifier circuit is obtained wherein, even when the output from the amplifier circuit is short-circuited to one of a power supply line and a ground, current flow in the push-pull amplifier circuit does not exceed a maximum current, and an output from the stabilized power supply circuit is stably maintained at a predetermined voltage.

5. The amplifier circuit according to claim 4 wherein
   the push-pull amplifier circuit of said auxiliary output means includes an NPN transistor and a PNP transistor connected in an emitter-follower configuration, a resistor connected between the output terminal and one of the NPN and PNP transistors of the push-pull amplifier circuit, and a resistor connected between the output terminal and the other of the NPN and PNP transistors;
   the second current limiter of said auxiliary output means includes a current limiting NPN transistor having a collector and a base respectively connected to a base and emitter of the NPN transistor of the push-pull amplifier circuit, the current limiting NPN transistor having an emitter connected to the output terminal, and a current limiting PNP transistor having a collector and a base respectively connected to a base and an emitter of the PNP transistor of the push-pull amplifier circuit, the current limiting PNP transistor having an emitter connected to the output terminal; and
   the push-pull amplifier circuit including the NPN transistor and the PNP transistor is driven by the first transistor.

* * * * *